US008154317B2

(12) United States Patent
Steedman et al.

(10) Patent No.: US 8,154,317 B2
(45) Date of Patent: *Apr. 10, 2012

(54) INTEGRATED CIRCUIT DEVICE TO SUPPORT INDUCTIVE SENSING

(75) Inventors: Sean Steedman, Phoeniz, AZ (US); Keith E. Curtis, Gilbert, AZ (US); Radu Ruscu, Bucharest (RO); Petru Cristian Pop, Bucharest (RO)

(73) Assignee: Microchip Technology Incorporated, Chandler, AZ (US)

( * ) Notice: Subject to any disclaimer, the term of this patent is extended or adjusted under 35 U.S.C. 154(b) by 275 days.

This patent is subject to a terminal disclaimer.

(21) Appl. No.: 12/560,855

(22) Filed: Sep. 16, 2009

(65) Prior Publication Data

US 2010/0090716 A1 Apr. 15, 2010

Related U.S. Application Data

(60) Provisional application No. 61/104,012, filed on Oct. 9, 2008.

(51) Int. Cl.
*G01R 31/26* (2006.01)
*G01R 31/3187* (2006.01)

(52) U.S. Cl. ............... 324/762.01; 324/750.3

(58) Field of Classification Search .. 324/750.01–750.3, 324/762.01–762.1, 239, 207.15; 327/372, 327/304, 177, 110, 139
See application file for complete search history.

(56) References Cited

U.S. PATENT DOCUMENTS

| 3,944,912 | A | 3/1976 | Angel et al. ............... 324/41 |
| 5,546,806 | A | 8/1996 | Kain ....................... 73/514.31 |
| 7,296,485 | B2 | 11/2007 | Kain ........................... 73/862 |
| 7,667,693 | B2 * | 2/2010 | Chung et al. ............... 345/173 |
| 2010/0090717 | A1 * | 4/2010 | Steedman et al. .......... 324/763 |

FOREIGN PATENT DOCUMENTS

EP 0 304 272 A2 2/1989

OTHER PUBLICATIONS

International PCT Search Report and Written Opinion, PCT/US2009/058979, 14 pages, Mailed Jul. 15, 2010.
International PCT Search Report and Written Opinion, PCT/US2009/059000, 13 pages, Mailed Feb. 15, 2010.

(Continued)

*Primary Examiner* — Huy Q Phan
*Assistant Examiner* — Tung X Nguyen
(74) *Attorney, Agent, or Firm* — King & Spalding L.L.P.

(57) ABSTRACT

An integrated circuit device inductive touch analog front end (AFE) excites selected ones of a plurality of inductive touch sensors, measures voltages across the coils of the plurality of inductive touch sensors, and provides analog output signals representative of these coil voltages. A physical displacement (touch) to the inductive sensor causes the inductance value of the inductive touch sensor to change with a corresponding change in a voltage across the coil of the inductive touch sensor. A digital processor controls selection of each one of the plurality of inductive touch sensors and receives the respective analog output voltage signal from the inductive touch AFE. When a sufficient change in the coil voltage is determined by the digital processor, that inductive touch sensor is assumed to have been actuated and the digital processor takes action based upon which one of the plurality of inductive touch sensors was actuated (touched).

21 Claims, 6 Drawing Sheets

OTHER PUBLICATIONS

Bhansali, Shekhar, et al., "Prototype Feedback-Controlled Bidirectional Actuation System for MEMS Applications", Journal of Microelectromechanical Systems, vol. 9, No. 2, XP011034557, pp. 245-251, Jun. 2000.

Casanella, Ramon, et al., "Synchronous Demodulator for Autonomous Sensors", IEEE Transactions on Instrumentation and Measurement, vol. 56, No. 4, pp. 1219-1223, Aug. 2007.

Fraden, Jocob; "Handbook of Modern Sensors", Springer-Verlag, New York, US, XP-002564092, pp. 263-264, 2004.

International Preliminary Report on Patentability, PCT/US2009/058979, 6 pages, Apr. 12, 2011.

International Preliminary Report on Patentability, PCT/US2009/059000, 6 pages, Apr. 12, 2011.

"Inductive Touch Sensor Design", by Keith Curtis, Microchip Technology Inc. Brochure AN1239, 14 pages, 2008.

* cited by examiner

INTEGRATED CIRCUIT DEVICE TO SUPPORT INDUCTIVE SENSING

RELATED PATENT APPLICATIONS

This application claims priority to commonly owned U.S. Provisional Patent Application Ser. No. 61/104,012; filed Oct. 9, 2008, and is related to commonly owned U.S. patent application Ser. No. 12/560,906; filed Sep. 16, 2009; and both are hereby incorporated by reference herein for all purposes.

TECHNICAL FIELD

The present disclosure relates to integrated circuits, and more particularly to, an integrated circuit device that supports inductive sensing.

BACKGROUND

Capacitive sensors, e.g., touch sensors, are widely used as user interfaces for a wide variety of consumer, commercial, industrial and military applications. However, capacitive touch sensors suffer from several shortcomings such as sensitivity to spilled liquids and unreliable operation when a user is wearing heavy gloves. Inductive touch sensors solve the shortcomings of capacitive touch sensors and have started to replace them in certain specialized applications not completely suited for the capacitive touch sensors. Inductive touch sensors require appropriate specialized interface circuits when used in an electronic system. Present technology inductive sensor interface circuits require a significant number of external discrete components to operate. These external discrete components are expensive and require a large amount of circuit board area for use in a system application.

SUMMARY

Therefore there is a need for an integrated circuit device that supports detection of the actuation of inductive sensors and provides useful outputs therefrom. The inductive sensor may be used to sense a touch causing an inductive change in the sensor. The integrated circuit interface that supports the operation of the inductive sensor will have control mechanisms that substantially eliminate the need for external components, thus reducing physical size and costs of manufacture for systems using inductive sensors.

According to a specific example embodiment of this disclosure, an integrated circuit device configured as an analog front end for supporting inductive touch sensing comprises: a voltage reference; a synchronous detector having a first input coupled to an inductive reference coil external connection, wherein the inductive reference coil external connection is adapted for coupling to an inductive reference coil; a second input coupled to an inductive touch sensor coil external connection, wherein the inductive touch sensor coil external connection is adapted for coupling to at least one inductive touch sensor coil; a third input coupled to a reference select external connection, wherein the reference select external connection is adapted for coupling to a reference select signal; a fourth input coupled to a clock external connection, wherein the clock external connection is adapted for coupling to a clock signal, and a fifth input coupled to the voltage reference; a coil driver having an output coupled to a coil drive output external connection, an input coupled to a coil drive input external connection; and an amplifier configured with a low-pass filter and having inputs coupled to the synchronous detector and an output having voltage values representative of inductance values of the at least one inductive touch sensor coil and the inductive reference coil, the output of the amplifier is coupled to a voltage detector output external connection; wherein the synchronous detector mixes the clock signal with a signal from the inductive reference coil or the at least one inductive touch sensor coil, as selected by the reference select signal, to produce sum and difference mixing products, whereby the amplifier amplifies the sum and difference mixing products and the low-pass filter substantially attenuates the sum mixing product and passes the difference mixing product to the output of the low-pass filter.

According to another specific example embodiment of this disclosure, an electronic system having an inductive touch interface comprises: an inductive touch interface comprising a plurality of inductive touch sensor coils and an inductive reference coil; a first integrated circuit digital processor; a second integrated circuit inductive touch analog front end comprising: a voltage reference; a synchronous detector having a first input coupled to the inductive reference coil; a second input coupled to the plurality of inductive touch sensor coils; a third input coupled to a reference select signal from the digital processor; a fourth input coupled to a clock signal from the digital processor, and a fifth input coupled to the voltage reference; a coil driver having an output coupled in series with the inductive reference coil and selected ones of the plurality of inductive touch sensor coils, an input coupled through an external low-pass filter to a clock output from the digital processor; and an amplifier configured with a low-pass filter and having inputs coupled to the synchronous detector and an output having voltage values representative of inductance values of the plurality of inductive touch sensor coils and the inductive reference coil, the output of the amplifier is coupled to an analog input of the digital processor; wherein the synchronous detector mixes the clock signal with a signal from the inductive reference coil or the at least one inductive touch sensor coil, as selected by the reference select signal, to produce sum and difference mixing products, whereby the amplifier amplifies the sum and difference mixing products and passes the difference mixing product at the output of the amplifier.

The synchronous detector may comprise: a decoder having a first input coupled to the clock external connection and a second input coupled to the reference select external connection; and six analog pass-gates controlled by the decoder, wherein inputs of first and fourth analog pass-gates are coupled to the voltage reference, inputs of second and fifth analog pass-gates are coupled to the plurality of inductive touch sensor coils, inputs of third and sixth analog pass-gates are coupled to the inductive reference coil; whereby the third and fourth analog pass-gates are closed when the reference select and clock signals are at first logic levels, the first and sixth analog pass-gates are closed when the reference select signal is at the first logic level and the clock signal is at a second logic level, the second and fourth analog pass-gates are closed when the reference select signal is at the second logic level and the clock signal is at the first logic level, and the first and fifth analog pass-gates are closed when the reference select and clock signals are at the second logic level.

The synchronous detector may also comprise: a frequency mixer; a decoder having a first input coupled to the clock and a second input coupled to the reference; and a plurality of multiplexers for selectively coupling the voltage reference, the inductive touch sensor, and the inductive reference coil external connection to the frequency mixer.

BRIEF DESCRIPTION OF THE DRAWINGS

A more complete understanding of the present disclosure thereof may be acquired by referring to the following description taken in conjunction with the accompanying drawings wherein.

Figure 1:
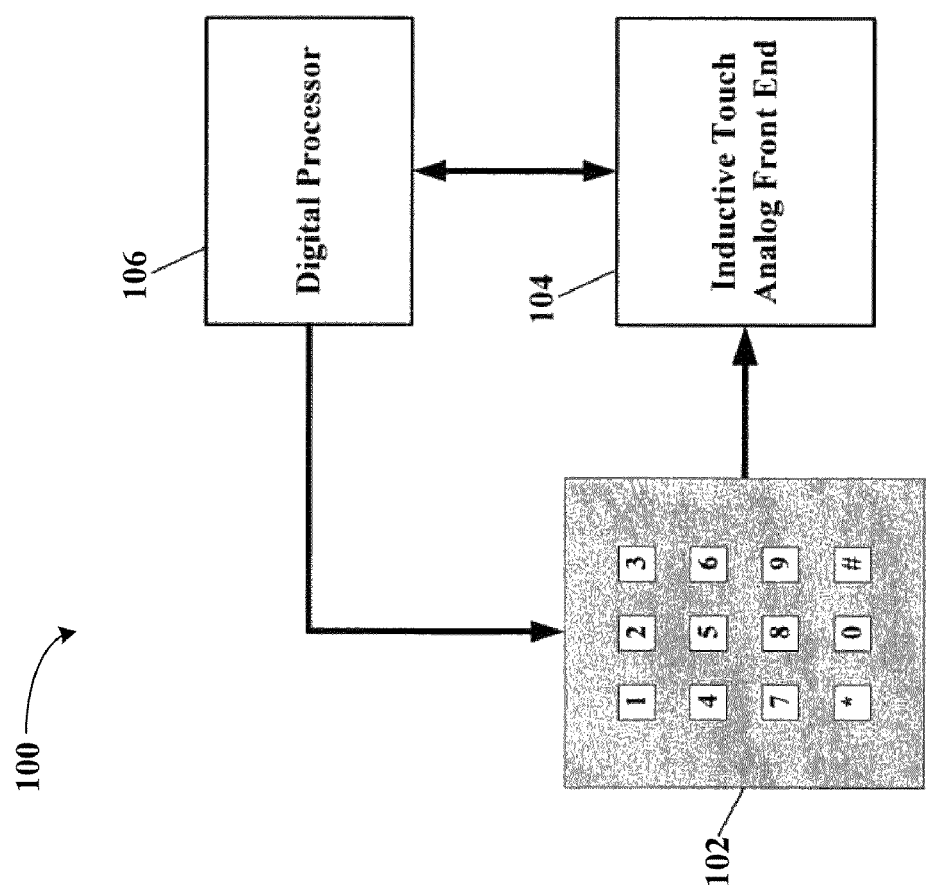
FIG. 1 is a schematic block diagram of an electronic system having an inductive touch keypad, an inductive touch analog front end and a digital processor, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular foil is disclosed herein, but on the contrary, this disclosure is to cover all modifications and equivalents as defined by the appended claims.

DETAILED DESCRIPTION

Referring now to the drawings, the details of an example embodiment is schematically illustrated. Like elements in the drawings will be represented by like numbers, and similar elements will be represented by like numbers with a different lower case letter suffix.

Referring to FIG. 1, depicted is a schematic block diagram of an electronic system having an inductive touch keypad, an inductive touch analog front end and a digital processor, according to a specific example embodiment of this disclosure. A digital processor 106, e.g., a microprocessor, microcomputer, digital signal processor (DSP), application specific integrated circuit (ASIC), programmable logic array (PLA), etC., is coupled to an inductive touch analog front end (AFE) 104 and a matrix of inductive touch sensors 102. Preferred inductive touch sensors 102 are Microchip inductive mTouch™ sensors more fully described at www.microchip.com.

The inductive touch AFE 104 facilitates, with a single low-cost integrated circuit device, all active functions used in determining when there is actuation of inductive sensors, e.g., by pressing and deflecting a target key that changes the inductance value of an associated inductive sensor. The inductive touch AFE 104 measures the inductance value of each key of the matrix of inductive touch sensors 102 and converts the inductance values into respective analog direct current (dc) voltages that are read and converted into digital values by the digital processor 106. A reference inductor (e.g., coil) (FIGS. 2 and 3) may also be included in the matrix of inductive touch sensors 102 for use as a comparison reference between an un-activated inductive sensor (coil) and an activated inductive sensor (coil), as more fully described hereinafter.

The digital processor 106 supplies clock and control functions to the inductive touch AFE 104, reads the analog voltage detector output of the inductive touch AFE 104, and selects each key of the matrix of inductive touch sensors 102 and the reference inductive sensor for processing by the inductive touch AFE 104, as more fully described hereinafter. When actuation of a key of the matrix of inductive touch sensors 102 is determined, the digital processor 106 will take an appropriate action.

Figure 2:
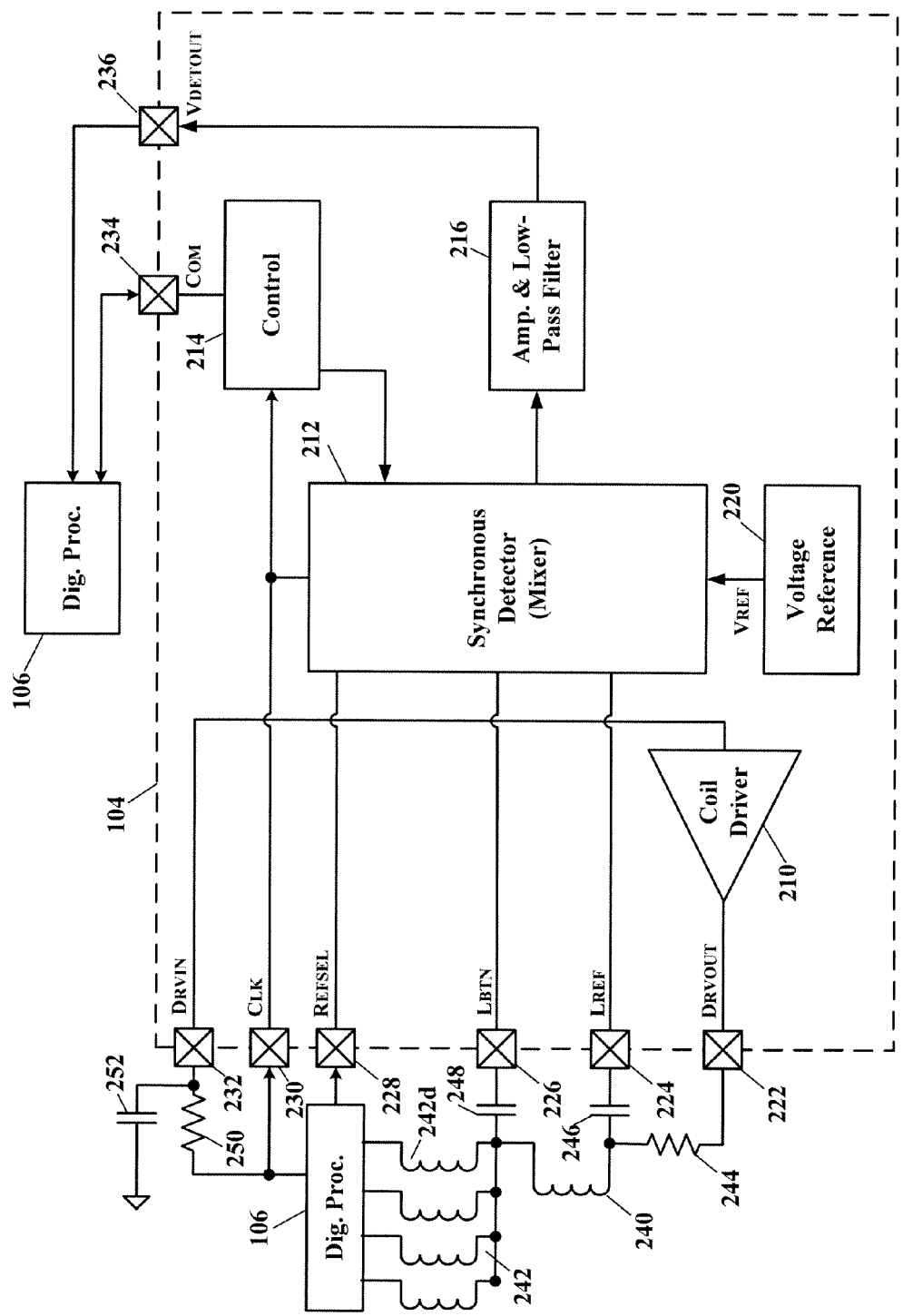
FIG. 2 is a more detailed schematic block diagram of the inductive touch analog front end shown in FIG. 1.

Referring to FIG. 2, depicted is a more detailed schematic block diagram of the inductive touch analog front end shown in FIG. 1. The inductive touch AFE 104 comprises a synchronous detector 212, a control module 214, a coil driver 210, a voltage reference 220, and an amplifier/low-pass filter 216. The synchronous detector 212 is used to extract signals from excitation of each touch sensor coil. Use of a synchronous detector (e.g., mixer) improves the signal-to-noise ratio of the detection process so as to produce useful or desired signals (utile signals) for use by the digital processor 106. As explained more fully hereinafter, the alternating current (AC) voltage amplitude from each touch sensor coil is mixed with a clock signal to produce sum and difference frequencies of the two AC signals. Since the AC voltage amplitude from each inductive touch sensor coil is at the same frequency as the clock signal, there will be a direct current (DC) voltage component (difference frequency) and twice the clock signal frequency (sum frequency) signals as mixing products from the synchronous detector 212.

The amplifier/low-pass filter 216 is used as a buffer-amplifier/low pass filter between the synchronous detector 212 and the $V_{DETOUT}$ node 236. The amplifier/low-pass filter 216 functions as an integrator and passes the DC voltage (difference frequency mixing result) while effectively suppressing the twice clock frequency (sum frequency mixing result). At the output of the amplifier/low-pass filter 216 a DC voltage is available to the digital processor 106 that is proportional to the inductance value of a selected one of the plurality of inductive sensors 242 or the reference inductor 240, as more fully described hereinafter. The digital processor 106 converts the analog DC voltage from the inductive touch AFE 104 to a digital voltage representation thereof and associates that digital voltage representation with the selected inductive sensor 242 or reference inductor 240. Since the digital processor 106 selects the inductive sensor 242 or the reference inductor 240, matching of the DC voltage values to associated ones of the plurality of inductive sensors 242 and reference inductor 240 are easily made.

The voltage reference 220 may be set to have a voltage output of approximately one-half the supply voltage, and may be an operational amplifier configured with unity gain and a non-inverting input to a resister ladder voltage divider. Other types of voltage references may be used effectively so long as there is adequate voltage stability and sufficient low impedance drive capability.

The coil driver 210 receives a signal derived from the clock supplied by the digital processor 106 or from any other clock source available. A low-pass filter comprising capacitor 252 and resistor 250 attenuate the higher frequency components of the clock square wave signal so as to produce approximately a sinusoidal waveform that is input to the coil driver 210, amplified, and then made available to the plurality of inductive sensors 242 and the reference inductor 240 through a series connected resistor 244. Each of the plurality of inductive sensors 242 is selected by the digital processor 106 by connecting one end of the selected one of the plurality of inductive sensors 242 to a supply common, thereby completing the circuit from the coil driver 210 and producing a voltage across the selected one of the plurality of inductive sensors 242 from the AC current supplied by the coil driver 210. The synchronous detector 212 detects the voltage from each one of the plurality of inductive sensors 242 and the reference inductor 240 for subsequent processing by the digital processor 106. The coil driver 210 supplies current at the clock frequency to the reference coil 240 and the selected one of the plurality of inductive sensors 242 connected in series. When the approximately sinusoidal current is flowing through the reference coil 240 and the selected one of the plurality of inductive sensors 242, voltages proportional to the inductances are thereby generated.

Figure 3:
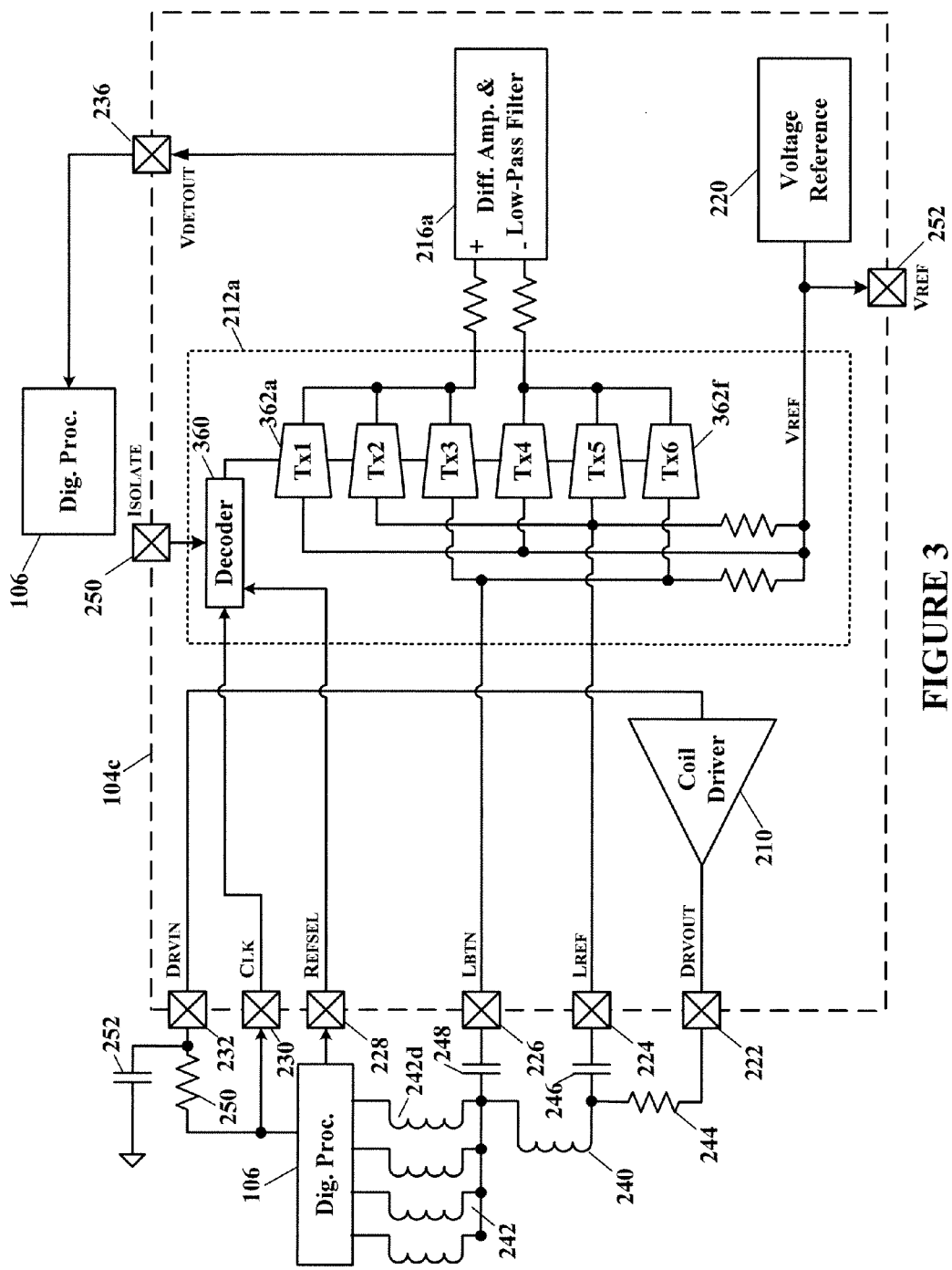
FIG. 3 is a more detailed schematic block diagram of a synchronous detector and the circuit functions shown in FIG. 2, according to a specific example embodiment of this disclosure.

Referring to FIG. 3, depicted is a more detailed schematic block diagram of a synchronous detector and the circuit functions shown in FIG. 2, according to a specific example embodiment of this disclosure. The synchronous detector 212a comprises a decoder 360 and a plurality of analog pass-gates 362. The decoder 360 receives a clock ($C_{LK}$) signal at external connection 230 and an input selection ($R_{EFSEL}$) at external connection 228, both from the digital processor 106. The decoder 360 controls the on and off states of the plurality of analog pass-gates 362, as more fully described hereinafter.

The coil driver 210 generates AC voltages across the reference inductor 240 and the selected one of the plurality of inductive sensors 242 proportional to the inductances thereof. The selected one of the plurality of inductive sensor voltages ($L_{BTN}$) and the reference inductor voltage ($L_{REF}$) are coupled through DC blocking capacitors 246 and 248 to inputs of the synchronous detector 212a through external connections 224 and 226, respectively.

The plurality of analog pass-gates 362 may operate according to the following table:

| REFSEL | CLK | Tx1 | Tx2 | Tx3 | Tx4 | Tx5 | Tx6 | Remarks |
|---|---|---|---|---|---|---|---|---|
| 0 | 0 | open | open | close | close | open | open | LREF selected |
| 0 | 1 | close | open | open | open | open | close | LREF selected |
| 1 | 0 | open | close | open | close | open | open | LBTN selected |
| 1 | 1 | close | open | open | open | close | open | LBTN selected |

The synchronous detector 212a has three signal inputs used for measurement of the inductance of the inductive touch sensors, the reference inductor voltage ($L_{REF}$), the selected one of the plurality of inductive sensor voltage ($L_{BTN}$) and the reference voltage ($V_{REF}$) from the voltage reference 220. The synchronous detector 212a (mixer) can mix between two of the these three inputs at any given time at the frequency provided at the clock connection 230 ($C_{LK}$). For example, if $R_{EFSEL}$ is at a logic zero, then the synchronous detector 212a mixes the reference inductor voltage and reference voltage signals. If the $R_{EFSEL}$ is at a logic one, then the synchronous detector 212a mixes the selected one of the plurality of inductive sensor voltage ($L_{BTN}$) and reference voltage ($L_{REF}$) signals. By alternately mixing the reference inductor voltage or the selected one of the plurality of inductive sensor voltages ($L_{BTN}$) with the reference voltage ($L_{REF}$) at the same frequency as the approximately sinusoidal voltage being produced by the coil driver 210, a DC signal and an AC signal are generated at the output of the synchronous detector 212a (mixer) that is applied to the differential inputs of differential amplifier/low-pass filter 216a.

The differential amplifier/low-pass filter 216a is used as a buffer-amplifier/low pass filter between the synchronous detector 212a and the $V_{DETOUT}$ node 236. The amplifier/low-pass filter 216a functions as an integrator and passes the DC voltage (difference frequency mixing result) while effectively suppressing the twice clock frequency (sum frequency mixing result). This DC voltage represents the inductance of the measured reference or selected touch sensor inductor, as discussed more fully above. The DC voltage may be fed to an analog-to-digital converter (ADC) (not shown) that is part of the digital processor 106, whereby the digital processor 106 samples and performs inductive touch calculations in determining when a touch sensor is actuated.

Also by alternating the polarity of connecting the touch inductor or reference inductor signals frequency mixing occurs that produces the sum and the difference frequencies between the clock input frequency and the frequency of the coil voltage. Since both frequencies are the same (the output of the coil driver 210 is derived from the clock signal input) the mixing product sum of the frequencies will be twice the clock frequency and the difference of the frequencies will be at zero frequency, a DC voltage that is proportional to the inductance value of the measured coil. The differential outputs from the closed ones of the plurality of analog pass-gates 362 are applied to the differential inputs of the amplifier/low-pass filter 216a. The voltage reference 220 DC biases the circuits of the synchronous detector 212a at about one-half the operating voltage for optimal operation of the amplifier/low-pass filter 216a. The amplifier/low-pass filter 216a converts the differential output from the synchronous detector 212a to a single-ended voltage output, whereby DC utile (useful, desired) signals are made available to an analog input of the digital processor 106. An isolate signal may be applied at node 250 to turn off all of the plurality of analog pass-gates 362 so as to isolate the amplifier/low-pass filter 216a from the plurality of inductive sensors 242 and the inductive sensor 240 during a Vref measurement at node 252, otherwise during normal operation the synchronous detector 212a functions as described hereinabove.

Figure 4:
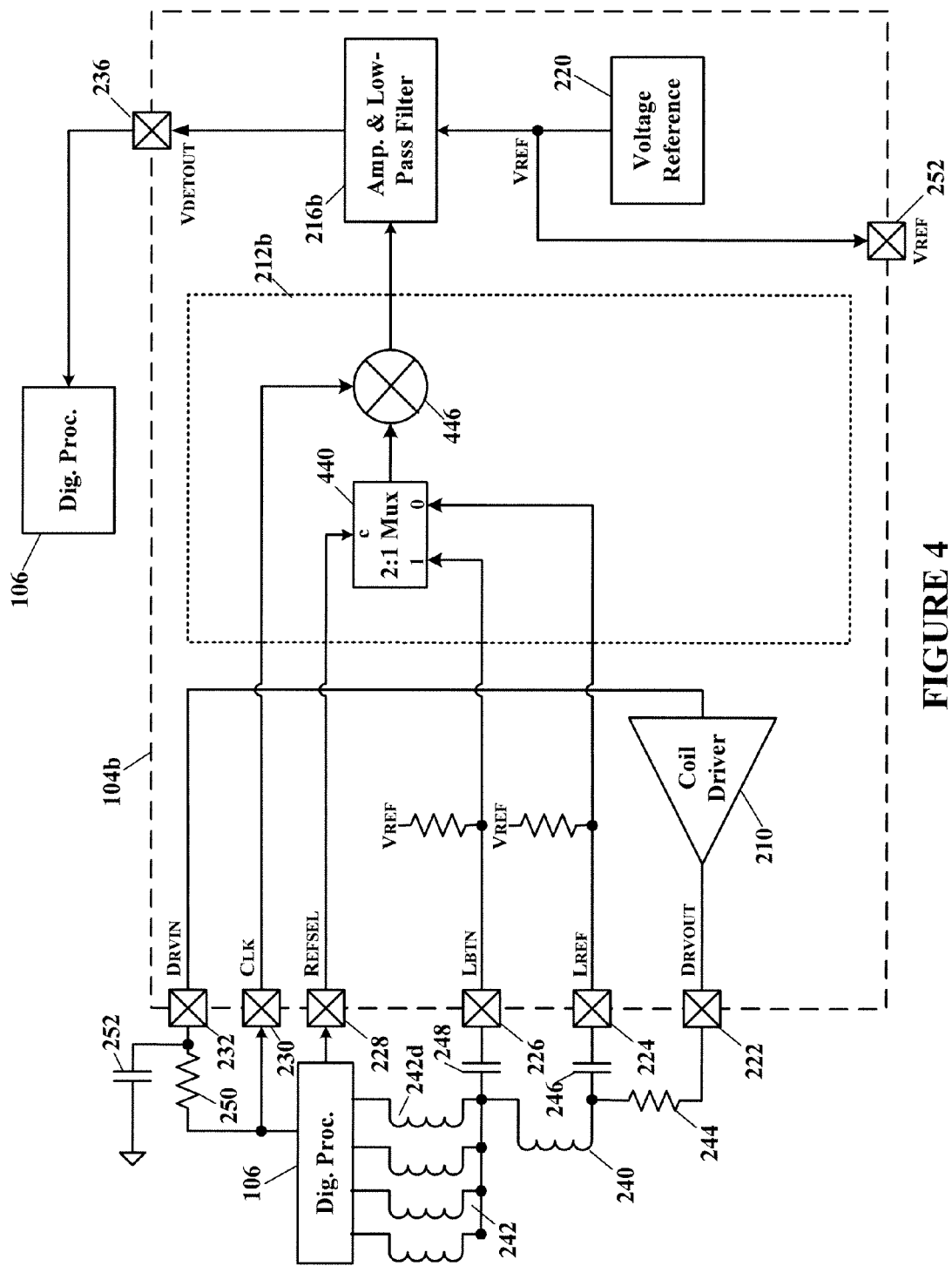
FIG. 4 is a more detailed schematic block diagram of a synchronous detector and the circuit functions shown in FIG. 2, according to another specific example embodiment of this disclosure.

Referring to FIG. 4, depicted is a more detailed schematic block diagram of a synchronous detector and the circuit functions shown in FIG. 2, according to another specific example embodiment of this disclosure. The synchronous detector 212b comprises multiplexers 440, 442 and 444, and a frequency mixer 446. Operation of this embodiment of the synchronous detector 212b is similar to the operation of the synchronous detector 212a shown in FIG. 3, and described hereinabove.

Figure 5:
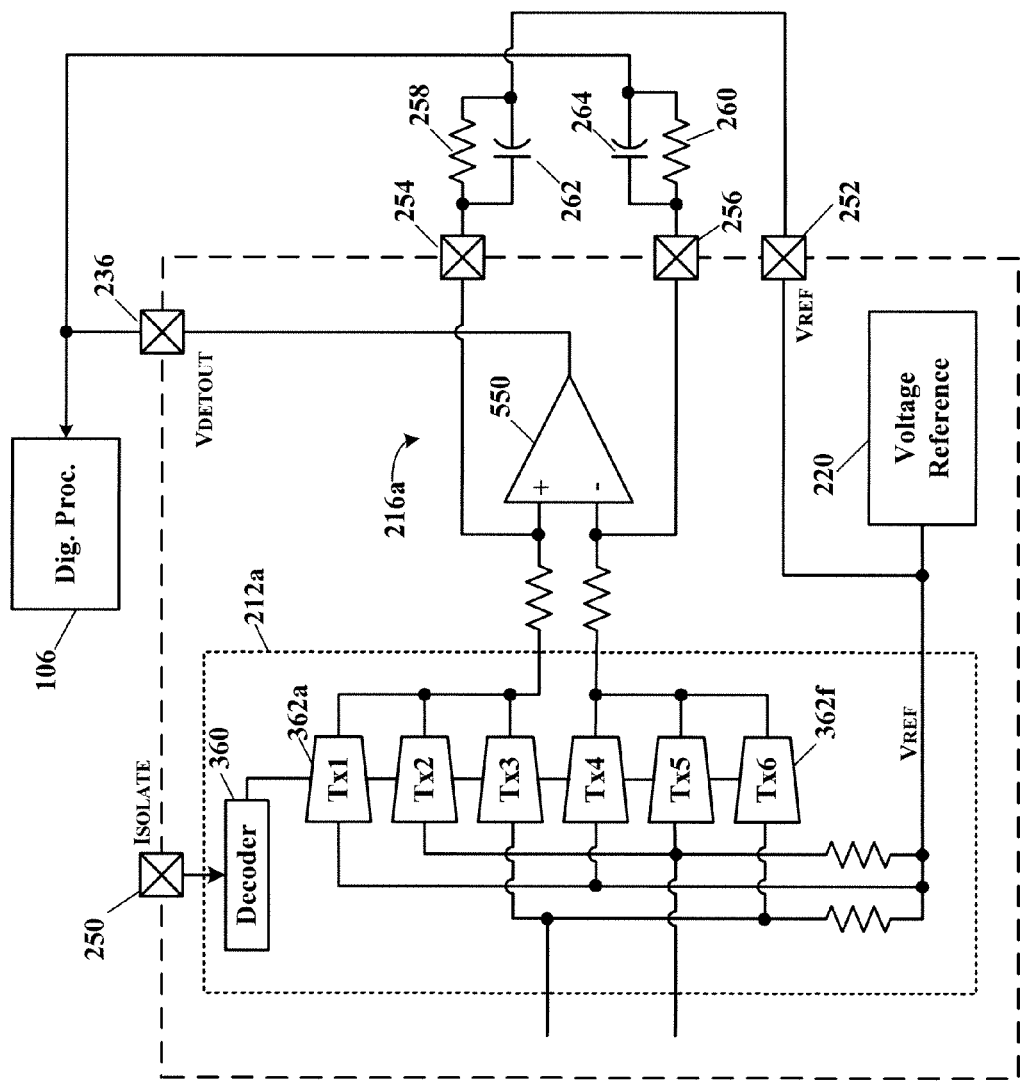
FIG. 5 is a more detailed schematic block diagram of the amplifier and low-pass filter shown in FIG. 3, according to a specific example embodiment of this disclosure.

Referring to FIG. 5, depicted is a more detailed schematic block diagram of the amplifier/low-pass filter shown in FIG. 3, according to a specific example embodiment of this disclosure. The amplifier/low-pass filter 216 may comprise an amplifier 550 having differential inputs, e.g., differential input operational amplifier; feedback resistors 258 and 260, and capacitors 262 and 264 arranged in a low-pass filter configuration. It is contemplated and within the scope of this disclosure that other amplifier and low pass filter configurations may be used for the amplifier/low-pass filter 216, as would be know to one of ordinary skill in analog circuit design and having the benefit of this disclosure.

Figure 6:
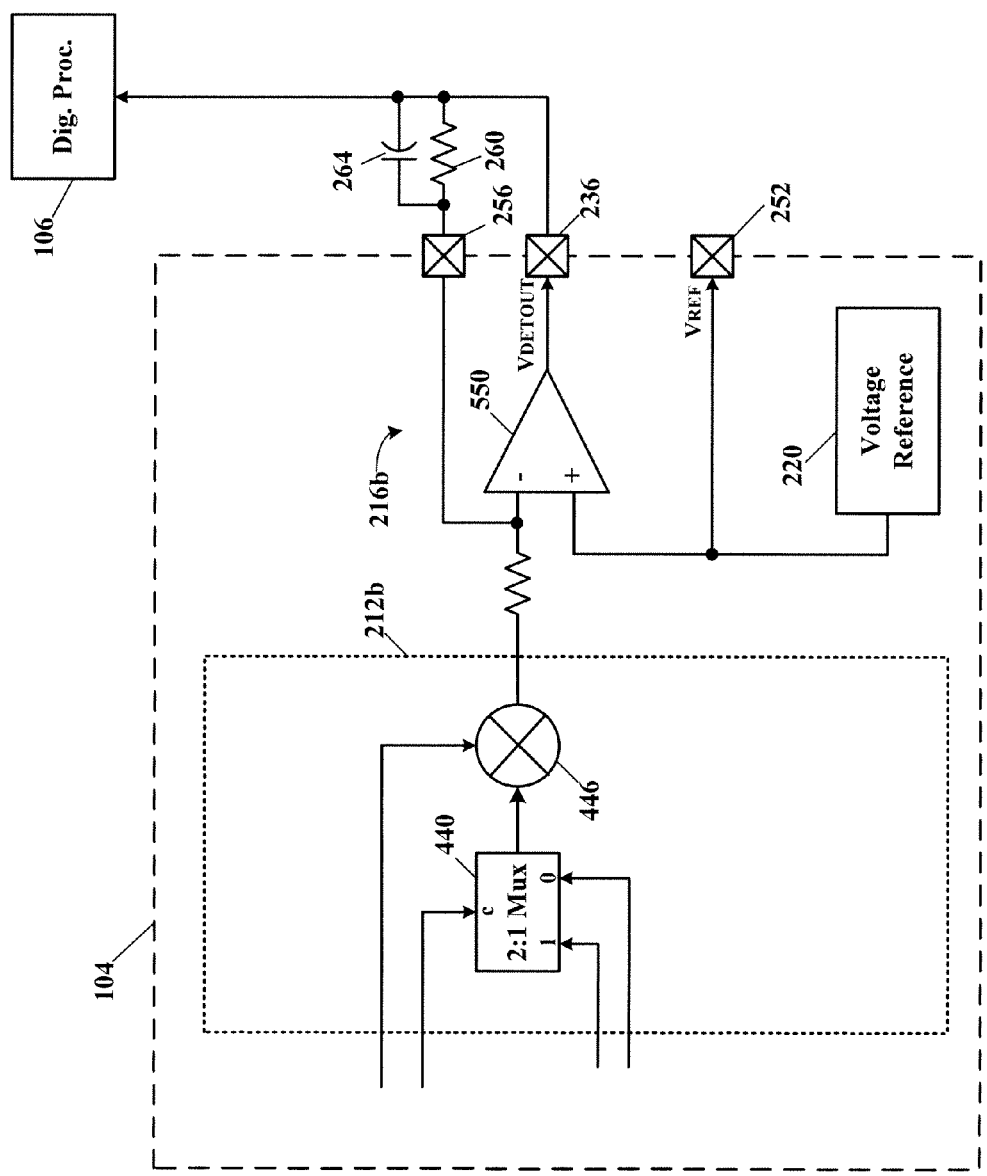
FIG. 6 is a more detailed schematic block diagram of the amplifier and low-pass filter shown in FIG. 4, according to another specific example embodiment of this disclosure.

Referring to FIG. 6, depicted is a more detailed schematic block diagram of the amplifier and low pass filter shown in FIG. 4, according to a specific example embodiment of this disclosure. The amplifier/low-pass filter 216b may comprise an amplifier 550 having differential inputs, e.g., differential input operational amplifier; feedback resistor 260, and capacitor 264 arranged in a low-pass filter configuration. It is contemplated and within the scope of this disclosure that other amplifier and low pass filter configurations may be used for the amplifier/low-pass filter 216b, as would be know to one of ordinary skill in analog circuit design and having the benefit of this disclosure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device configured as an analog front end for supporting inductive touch sensing, said integrated circuit device comprising:
    a voltage reference;
    a synchronous detector having
       a first input coupled to an inductive reference coil external connection, wherein the inductive reference coil external connection is adapted for coupling to an inductive reference coil;
       a second input coupled to an inductive touch sensor coil external connection, wherein the inductive touch sensor coil external connection is adapted for coupling to at least one inductive touch sensor coil;
       a third input coupled to a reference select external connection, wherein the reference select external connection is adapted for coupling to a reference select signal;
       a fourth input coupled to a clock external connection, wherein the clock external connection is adapted for coupling to a clock signal, and
       a fifth input coupled to the voltage reference;
    a coil driver having
       an output coupled to a coil drive output external connection,
       an input coupled to a coil drive input external connection; and
    an amplifier configured with a low-pass filter and having inputs coupled to the synchronous detector and an output having voltage values representative of inductance values of the at least one inductive touch sensor coil and the inductive reference coil, the output of the amplifier is coupled to a voltage detector output external connection;
    wherein the synchronous detector mixes the clock signal with a signal from the inductive reference coil or the at least one inductive touch sensor coil, as selected by the reference select signal, to produce sum and difference mixing products, whereby the amplifier amplifies the sum and difference mixing products and the low-pass filter substantially attenuates the sum mixing product and passes the difference mixing product to the output of the low-pass filter.

2. The integrated circuit device according to claim 1, wherein the synchronous detector comprises:
    a decoder having a first input coupled to the clock external connection and a second input coupled to the reference select external connection; and
    six analog pass-gates controlled by the decoder, wherein inputs of first and fourth analog pass-gates are coupled to the voltage reference,
    inputs of second and fifth analog pass-gates are coupled to the inductive touch sensor external connection,
    inputs of third and sixth analog pass-gates are coupled to the inductive reference coil external connection;
    whereby
    the third and fourth analog pass-gates are closed when first logic levels are on the reference select and clock external connections,
    the first and sixth analog pass-gates are closed when the first logic level is on the reference select external connection and a second logic level is on the clock external connection,
    the second and fourth analog pass-gates are closed when the second logic level is on the reference select external connection and the first logic level is on the clock external connection, and
    the first and fifth analog pass-gates are closed when second logic levels are on the reference select and clock external connections.

3. The integrated circuit device according to claim 2, wherein the first logic level is a logic zero ("0") and the second logic level is a logic one ("1").

4. The integrated circuit device according to claim 2, wherein the second logic level is a logic zero ("0") and the first logic level is a logic one ("1").

5. The integrated circuit device according to claim 2, further comprising a frequency divider in combination with the decoder, wherein the frequency divider divides a clock frequency from the clock external connection and applies the divided clock frequency to the analog pass-gates.

6. The integrated circuit device according to claim 1, wherein the amplifier is a differential input operational amplifier.

7. The integrated circuit device according to claim 1, wherein a digital processor determines which one of the at least one inductive touch sensor coil is selected for voltage measurement by the synchronous detector.

8. The integrated circuit device according to claim 7, wherein the digital processor supplies the clock and reference select signals.

9. The integrated circuit device according to claim 7, wherein the digital processor receives the voltage values from the output of the amplifier, determines which one of the at least one inductive touch sensor coil is actuated based upon the received voltage values.

10. The integrated circuit device according to claim 1, wherein the synchronous detector comprises:
    a frequency mixer;
    a decoder having a first input coupled to the clock external connection and a second input coupled to the reference select external connection; and
    a plurality of multiplexers for selectively coupling the voltage reference, the inductive touch sensor external connection, and the inductive reference coil external connection to the frequency mixer.

11. The integrated circuit device according to claim 10, further comprising a frequency divider for dividing a clock frequency from the clock external connection and applying the divided clock frequency to the plurality of multiplexers.

12. An electronic system having an inductive touch interface, said system comprising:
    an inductive touch interface comprising a plurality of inductive touch sensor coils and an inductive reference coil;
    a first integrated circuit digital processor;

a second integrated circuit inductive touch analog front end comprising:
a voltage reference;
a synchronous detector having
a first input coupled to the inductive reference coil;
a second input coupled to the plurality of inductive touch sensor coils;
a third input coupled to a reference select signal from the digital processor;
a fourth input coupled to a clock signal from the digital processor, and
a fifth input coupled to the voltage reference;
a coil driver having
an output coupled in series with the inductive reference coil and selected ones of the plurality of inductive touch sensor coils,
an input coupled through an external low-pass filter to a clock output from the digital processor; and
an amplifier configured with a low-pass filter and having inputs coupled to the synchronous detector and an output having voltage values representative of inductance values of the plurality of inductive touch sensor coils and the inductive reference coil, the output of the amplifier is coupled to an analog input of the digital processor;
wherein the synchronous detector mixes the clock signal with a signal from the inductive reference coil or the at least one inductive touch sensor coil, as selected by the reference select signal, to produce sum and difference mixing products, whereby the amplifier amplifies the sum and difference mixing products and passes the difference mixing product at the output of the amplifier.

13. The system according to claim 12, wherein the synchronous detector comprises:
a decoder having a first input coupled to the clock external connection and a second input coupled to the reference select external connection; and
six analog pass-gates controlled by the decoder, wherein
inputs of first and fourth analog pass-gates are coupled to the voltage reference,
inputs of second and fifth analog pass-gates are coupled to the plurality of inductive touch sensor coils,
inputs of third and sixth analog pass-gates are coupled to the inductive reference coil;
whereby the third and fourth analog pass-gates are closed when the reference select and clock signals are at first logic levels,
the first and sixth analog pass-gates are closed when the reference select signal is at the first logic level and the clock signal is at a second logic level,
the second and fourth analog pass-gates are closed when the reference select signal is at the second logic level and the clock signal is at the first logic level, and
the first and fifth analog pass-gates are closed when the reference select and clock signals are at the second logic level.

14. The system according to claim 13, wherein the first logic level is a logic zero ("0") and the second logic level is a logic one ("1").

15. The system according to claim 13, wherein the second logic level is a logic zero ("0") and the first logic level is a logic one ("1").

16. The system according to claim 12, wherein the synchronous detector comprises:
a frequency mixer;
a decoder having a first input coupled to the clock signal and a second input coupled to the reference select signal; and
a plurality of multiplexers for selectively coupling the voltage reference, the inductive touch sensor signal, and the inductive reference coil signal to the frequency mixer.

17. The system according to claim 16, further comprising a frequency divider for dividing the clock signal and applying the divided clock signal to the plurality of multiplexers.

18. The system according to claim 12, wherein the amplifier is a differential input operational amplifier.

19. The system according to claim 12, wherein a digital processor determines which one of the at least one inductive touch sensor coil is selected for voltage measurement by the synchronous detector.

20. The system according to claim 12, wherein the digital processor is a microcontroller.

21. The system according to claim 12, wherein the digital processor is selected from the group consisting of a microprocessor, a digital signal processor (DSP), an application specific integrated circuit (ASIC), and a programmable logic array (PLA).

* * * * *